United States Patent

Asai

[19]

[11] Patent Number: 6,150,245
[45] Date of Patent: Nov. 21, 2000

[54] METHOD OF MANUFACTURING A FIELD EFFECT TRANSISTOR

[75] Inventor: Shuji Asai, Tokyo, Japan

[73] Assignee: NEC Corporation, Japan

[21] Appl. No.: 09/419,850

[22] Filed: Oct. 19, 1999

Related U.S. Application Data

[62] Division of application No. 08/807,325, Feb. 27, 1997, Pat. No. 6,069,325.

[51] Int. Cl.[7] ............................ H01L 21/28; H01L 21/44; H01L 21/336
[52] U.S. Cl. .......................... 438/572; 438/570; 438/571; 438/257
[58] Field of Search ................................. 438/570, 571, 438/572, 257, 167

[56] References Cited

U.S. PATENT DOCUMENTS

4,743,565  5/1988  Goth et al. .................. 437/32
5,599,738  2/1997  Hashemi et al. .................. 437/187
6,027,972  2/2000  Kerber .................. 438/257

Primary Examiner—Matthew Smith
Assistant Examiner—Lex H Malsawma
Attorney, Agent, or Firm—Hayes, Soloway, Hennessey, Grossman & Hage, P.C.

[57] ABSTRACT

On a channel layer, there are disposed a gate electrode and a first contact layer of which a side surface is brought into contact with the gate electrode on the source side and of which a side surface is apart from the gate electrode on the drain side. Provided on the first contact layer is a second contact layer on which ohmic source and drain electrodes are arranged. A connection wiring is disposed on an upper end of the gate electrode. Specifically, there are provided a thin contact layer and a thick contact layer such that the thin contact layer is brought into contact with the gate electrode. Therefore, the problems of the contact resistance of the ohmic electrode and the gate parasitic capacitance are removed and both drawbacks can be improved at the same time.

2 Claims, 12 Drawing Sheets

METHOD OF MANUFACTURING A FIELD EFFECT TRANSISTOR

This is a divisional of application Ser. No. 08/807,325 filed on Feb. 27, 1997, now U.S. Pat. No. 6,069,325.

BACKGROUND OF THE INVENTION

The present invention relates to a field effect transistor (FET) and a method of manufacturing the same, and in particular to, a Schottky junction field effect transistor (referred to herein-after as an MESFET) and a heterojunction FET (referred to herein as an HJFET) and a method of manufacturing the same in which the FETs have a short gate length and include a metal layer on a side wall for decreasing source resistance and increasing the voltage applicable to the drain.

DESCRIPTION OF THE PRIOR ART

Compound semiconductors have a feature of a high electron mobility when compared with silicon transistors and hence have been broadly applied to field effect transistors and circuits in which compound semiconductors are integrated as analog signal amplifiers and digital signals processing circuits. To increase the cut-off frequency as a characteristic of MESFETs, it is required to decrease the gate length and, as a result, the gate capacitance thereof. To accomplish this a method in which a fine pattern is directly drawn on a resist film by an electron beam and then the pattern is copied onto a metal layer by dry etching is known in the art. This method, however has a problem that the electron beam lithography requires a long period of time and hence lowers the productivity in the fabrication of MESFETs.

Figure 1:
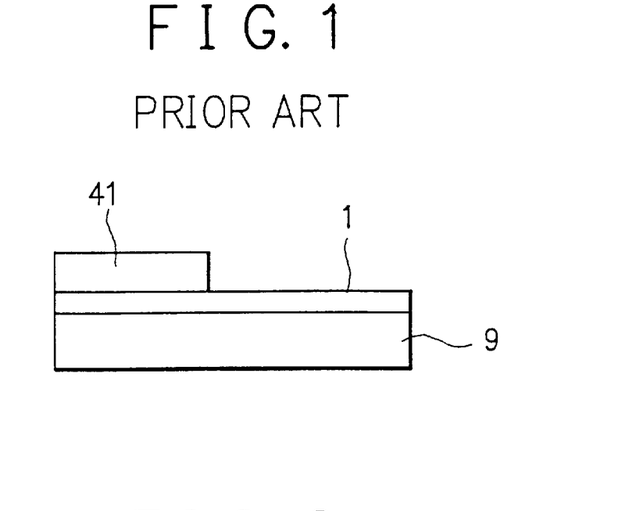
FIGS. 1 to 4 are cross-sectional views respectively showing steps of the manufacturing process of a field effect transistor in accordance with Prior Art Example 1.
Figure 2:
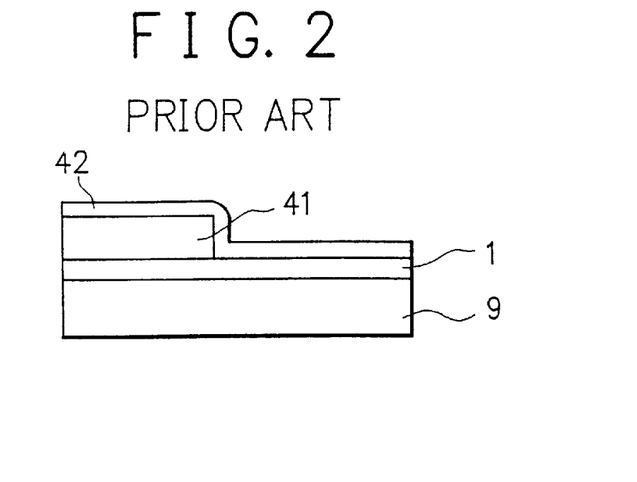
Figure 3:
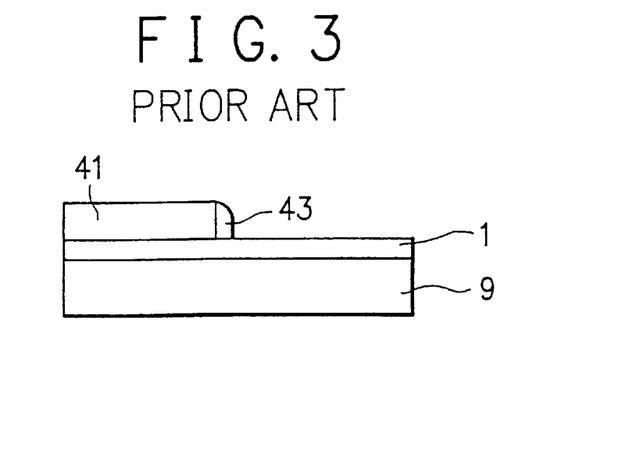
Figure 4:
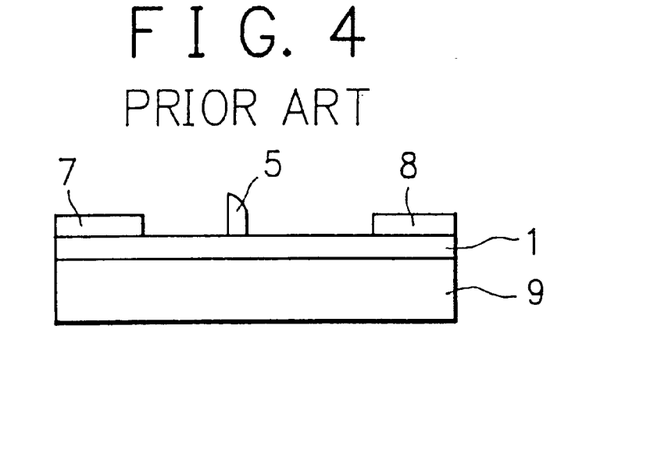

In the Japanese Patent Laid-Open Serial No. 1-107577 entitled "Method of Producing Field Effect Transistor", there is described a method of improving the productivity without using the electron beam drawing in which a metal side wall is employed (Prior Art Example 1). FIGS. 1 to 4 show the production method of the example. As can be seen from FIG. 1, on a surface of a semi-insulative GaAs substrate 9 including a channel layer (n-type GaAs), there is provided an insulator layer ($SiO_2$) 41 which is subjected to a dry etching process in a vertical direction. Subsequently, a Schottky metal layer (WSi) 42 is grown to cover the insulation layer ($SiO_2$) 41 as shown in FIG. 2. The Schottky metal layer 42 is then vertically dry etched to form a metal side wall 43 remaining on a side surface of the insulator layer 41 as shown in FIG. 3. Finally, as can be seen from FIG. 4, an etching process is applied to remove unnecessary excessive portions of the insulator layer 41' such that the metal side wall 43 is used as a fine gate electrode 5. Incidentally, FIG. 4 includes a source electrode 7 and a drain electrode 8.

As described above, the fine gate length can be fabricated with high precision using the vertical dry etching. However, in this device, the channel layer 1 is employed to form a channel to the source electrode 7 and, hence, has with a problem of a high resistance (source resistance) between the source 7 and the gate 8. Moreover, due to the reduced thickness of the gate electrode 5, there disadvantageously exists a high gate resistance related to a terminal of the gate electrode 5.

Figure 5:
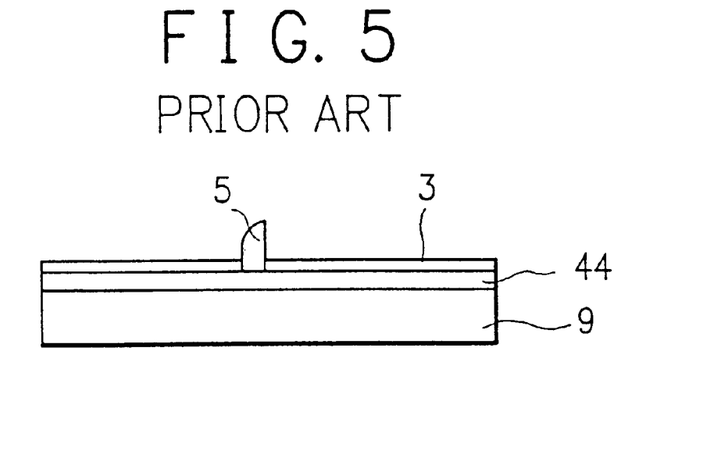
FIGS. 5 to 7 are cross-sectional views respectively showing steps of the manufacturing process of a field effect transistor in accordance with Prior Art Example 2.
Figure 6:
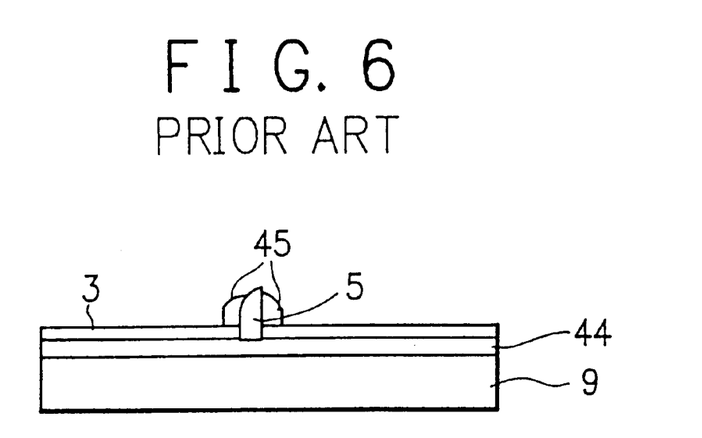
Figure 7:
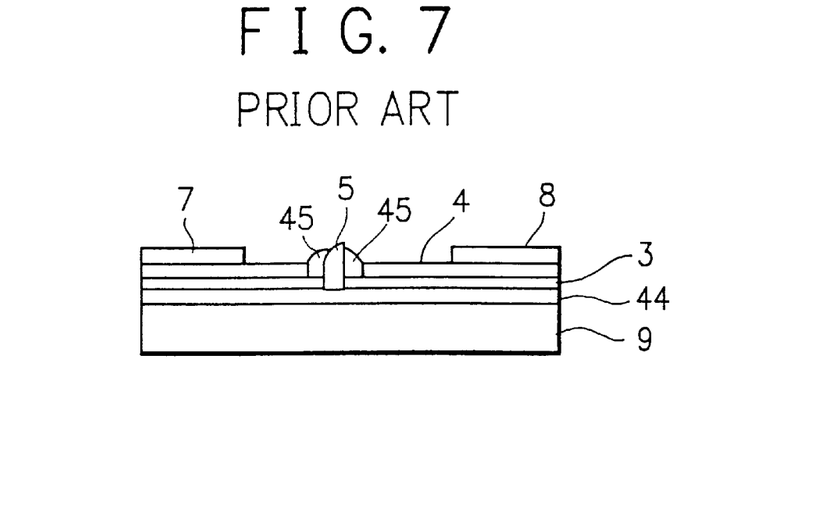

To solve this problem, according to the Japanese Patent Laid-Open Serial No. 4-212428 entitled "Method of Producing Semiconductor" (Prior Art Example 2), Prior Art Example 1 is improved to reduce the source resistance. FIGS. 5 to 7 show the method of Prior Art Example 2.

As shown in FIG. 5, on a semi-insulating GaAs substrate 9, there are epitaxially fabricated an i-type GaAs layer (not shown) as a buffer layer, and an electron transfer layer and an n-type AlGaAs as an enhancement electron supply layer 44. Thereafter, a photo-resist layer is patterned over the substrate 9 and a Schottky metal WSi is sputtered thereon to have a thickness of 150 nm. An anisotropic etching is conducted thereon in a reactive ion etching (RIE) process using $CF_4$ gas to remove the photo-resist layer so as to form a gate electrode 5 of the metal of WSi having a thickness of 100 nm. Utilizing a selective epitaxial growing technique, there is formed an n-type GaAs layer as a first contact layer (n-type GaAs) 3 with a carrier concentration of $2 \times 10^{18}$ cm$^{-3}$ and a thickness of 10 nm.

As can be seen from FIG. 6, a 180 nm thick $SiO_2$ layer is grown thereon and then an anisotropic RIE process is conducted to fabricate an insulator side wall 45 on side surfaces of the gate electrode 5. Next, an n-type GaAs layer is formed in a selective epitaxial growing process to manufacture a second contact layer 4 having a carrier concentration of $2 \times 10^{18}$ cm$^3$ and a thickness of 100 nm as shown in FIG. 7. Thereafter, source and drain electrodes 7 and 8 are formed on the second contact layer 4 to completely fabricate an enhancement HJFET.

In accordance with Prior Art Example 2, the first contact layer 3 is selectively and epitaxially formed to be brought into contact with the gate electrode 5, the surface depletion layer is separated from the electron supply layer 44 and, hence, the source resistance and drain resistance are advantageously minimized. Additionally, since there are provided two contact layers in which the second contact layer 4 is separated as above, the gate parasitic capacitance is decreased. However, since the source and drain electrodes 7 and 8 are symmetrically disposed in the device, the increase in the voltage applicable to the drain is disadvantageously limited.

Figure 8:
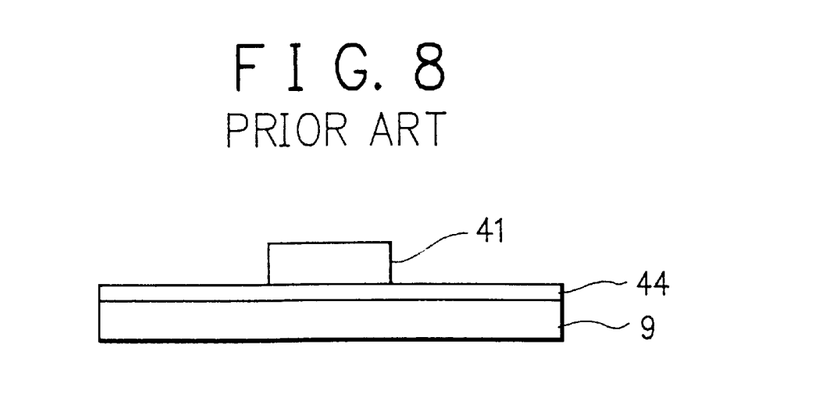
FIGS. 8 to 11 are cross-sectional views respectively showing steps of the manufacturing process of a field effect transistor in accordance with Prior Art Example 3.
Figure 9:
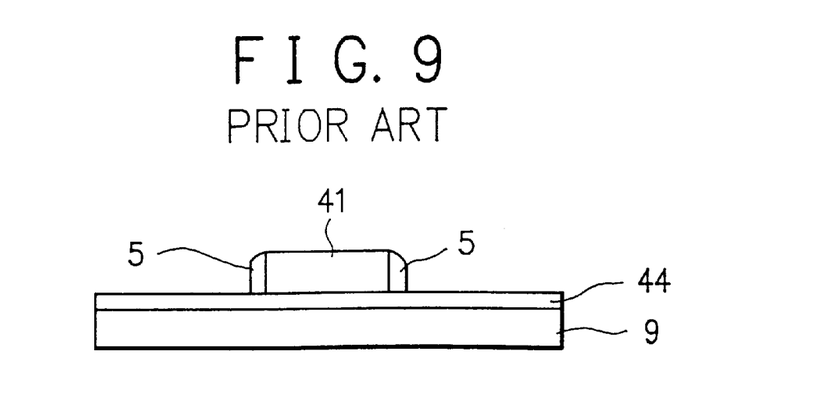
Figure 10:
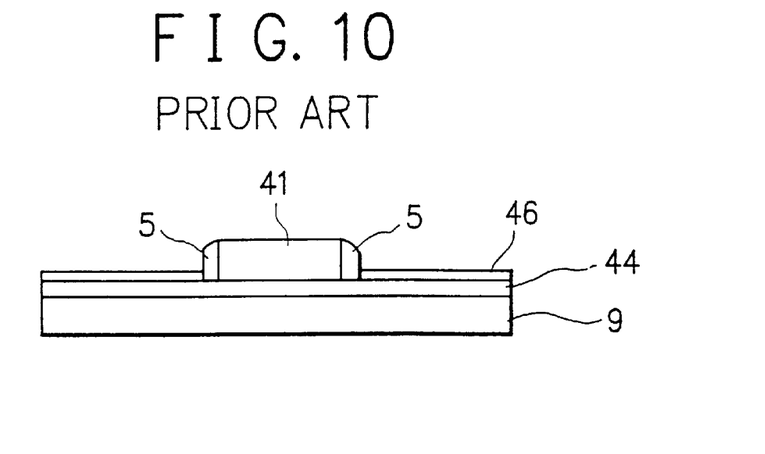
Figure 11:
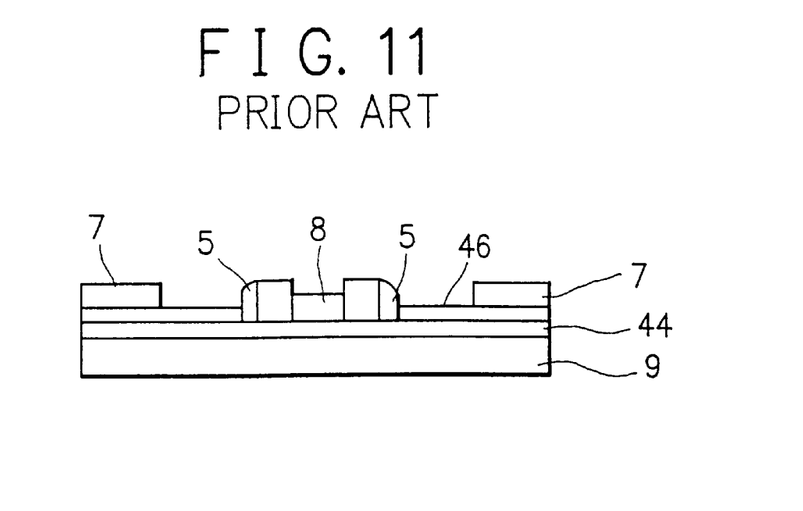

FIGS. 8 to 11 show a method of producing an asymmetric device to increase the voltage applicable to the drain. In FIG. 8, on a semi-insulative GaAs substrate 9, there are manufactured an i-type GaAs layer (not shown) as a buffer layer, an electron supply layer and an n-type AlGaAs layer as an electron supply layer 44. Over the substrate 9, a 400 nm thick insulation layer 41 is accumulated. Thereafter, using a photo-resist layer as a mask, a reactive ion etching process is carried out to manufacture a rectangular portion. As can be seen from FIG. 9, a 150 nm Schottky metal WSi is accumulated to undergo an anisotropic RIE step. As a result, there are formed metal side walls as gate electrodes 5 on both sides of the insulation layer 41. As shown in FIG. 10, conducting a selective epitaxial growing process, there is manufactured an n-type GaAs layer as a contact layer (n-type GaAs layer) 46 having a carrier density $2 \times 10^{19}$ cm$^3$ and a thickness of 100 nm. In FIG. 11, there is formed a source electrode 7 on the contact layer 46 and an opening is fabricated at a central position of the insulator layer 41 to manufacture a drain electrode 8 therein to thereby obtain a depletion HJFET.

In accordance with Prior Art Example 3, due to the contact layer 46 selectively and epitaxially formed on one side of the gate electrode 5, the source resistance is minimized. Also, because the ohmic drain electrode 8 is disposed to be separated from the gate electrode 5, the voltage applicable to the drain is increased. However, disadvantageously, the gate series resistance of the thin gate electrode on the side wall have a high resistance value.

To attempts to solve this problem, the Japanese Patent Laid-Open Serial No. 5-211170 entitled "Method of Manufacturing Field Effect Transistor" (Prior Art Example 4) has proposed a method of reducing the gate electrode. FIGS. 12 to 15 show a method of fabricating a field effect transistor of Prior Art Example 4.

Figure 12:
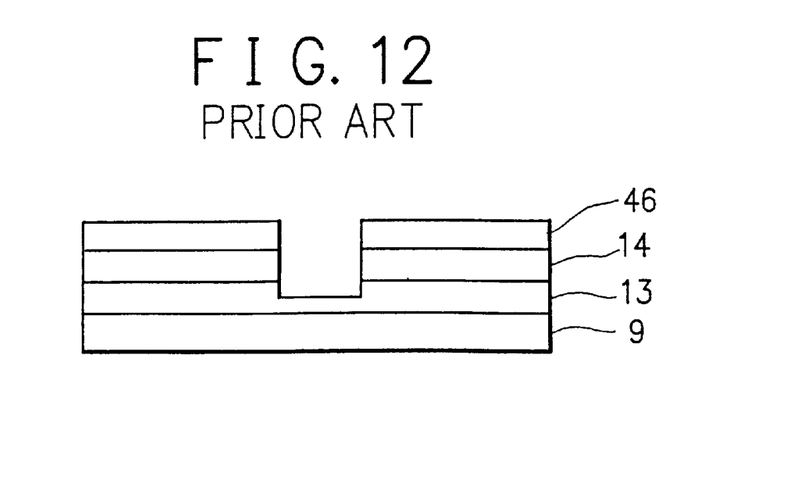
Figure 13:
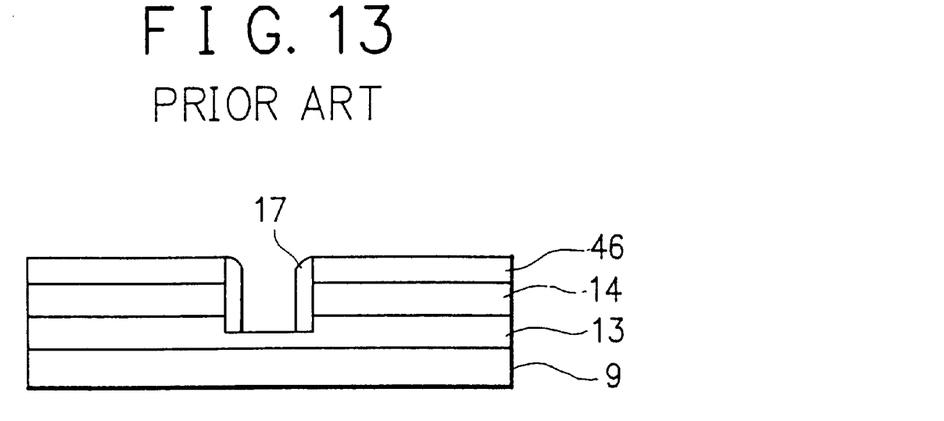

As shown in FIG. 12, over a semi-insulating GaAs substrate 9 (including a surface on which an n-type GaAs) is formed as a conductive layer 13 having a thickness of 250 nm. I-type AlGaAs and GaAs layers are fabricated thereon as a buffer layer, (not shown) on which there are grown a 0.3 μm insulating $SiO_2$ layer 14 and a first metal (Mo) layer 46 having a thickness of 0.5 μm. In these layers 14 and 46, there is thereafter formed an opening having a width of 0.7 μm. The conductive layer of n-type GaAs 13 is etched to 100 nm using $CCl_2F_2$ gas to provide a recess. As can be seen from FIG. 13, metal side walls 17 of $MoSi_2$ are fabricated on inner sides of the opening.

Figure 14:
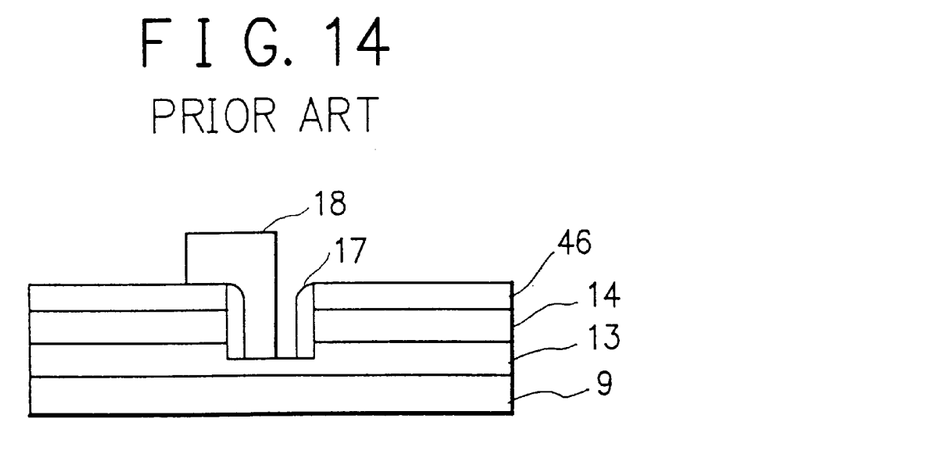
Figure 15:
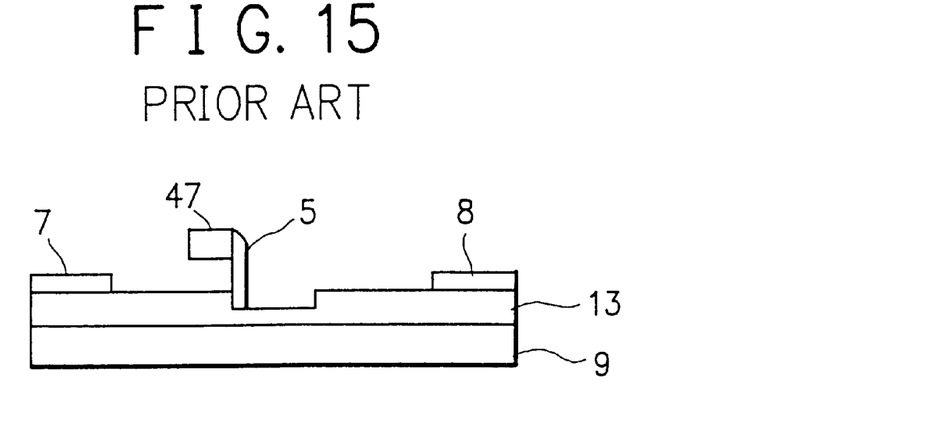

In FIG. 14, on the metal side wall 17 on one of the side walls of the opening, there is formed a photoresist layer 18 having a thickness of 1 μm and then unnecessary portions respectively of the metal side walls 17, metal layer 46, and insulator layer 14 are removed by etching. As a result, a gate electrode 5 having a cantilever 47 is manufactured on one side of the the recess opening as shown in FIG. 15. Using an ohmic alloy of AuGeNi, source and drain electrodes 7 and 8 are finally configured on the conductive layer 13 to thereby attain a complete FET device.

In accordance with Prior Art Example 4, thanks to the cantilever 47 additionally provided on the side wall electrode, the cross-sectional area of the gate electrode can be increased while retaining the fine gate length, thereby advantageously reducing the gate resistance. Furthermore, the gate electrode 5 is brought into contact with the source side in the recess and hence the source resistance is minimized. Since the drain side is separated therefrom; the voltage applicable to the drain can be increased.

Prior Art Examples 2 and 3 include a contact layer fabricated through selective epitaxial growth. On a surface of such compound exposed to the air, there is formed a degenerated layer in which its characteristics are changed due to oxides or hydroxides. It is quite difficult to completely remove the degenerated layer to desirably guarantee conductivity. When hydrochloric acid (HCl) gas or alsine ($AsH_3$) is supplied to the epitaxial layer growing apparatus in a heated state, the oxide layers are almost completely removed. However, oxides having a high binding characteristic remain in the upper-most layer. Moreover, when the temperature in the apparatus is increased to remove the oxides, crystalline component elements evaporate from the surface, which possibly results in crystal defects. When the epitaxial layer is grown on the crystal surface including such an oxide or defective layer, the resistance of the contact junction cannot be sufficiently lowered when compared with the case in which the layers are consecutively grown. In addition, aluminum of AlGaAs is easily oxidized and the resultant oxide cannot be easily removed. Consequently, the contact conductivity is lowered in the AlGaAs device when compared with the device using GaAs or the like.

In addition, in accordance with Prior Art Example 3, since the drain electrode is directly brought into contact with the thin channel (semiconductor) layer, there appears a high contact resistance. Furthermore, the electric field is concentrated on the end of electrode and the voltage applicable to the drain is lowered, hence the device is abruptly destroyed in some cases. The ohmic electrode related to alloy contact using AuGe or the like includes a layer which has been reacted with the alloy and which has a thickness of several tens of nm. These layers, when reacted with the alloy, have a high resistance, and particularly, these layers when reacted by an eutectic reaction with the alloy possesses high resistivity.

To overcome this difficulty, a conductive layer is generally remained below the alloy layer to pass an electric current therethrough. Namely, there is reserved an area through which the current passes the alloy layer to thereby totally reduce the contact resistance of the electrode. Conversely, for the case in which the conductive layer is thin and the electric current cannot pass therethrough, i.e., the conductive layer is only brought into contact with a side surface of the alloy layer, the resistance of the ohmic electrode is increased. Moreover, due to the reduced thickness and high resistivity, the alloy layer is easily destroyed because the electric field is concentrated thereon.

Additionally, in accordance with Prior Art Example 4, the gate electrode is disposed in a depletion structure and is brought into the conductive layer on the source side. Since the source resistance is low and the drain electrode is arranged on a thick conductive layer, the contact resistance is minimized. Because of the gap recess between the gate and the drain, the drain is operable with a high voltage. However, when the first conductive layer is thick and a large recess is disposed therein, the source resistance is reduced. Moreover, since the area of contact between the gate electrode and the conductive layer is increased, the gate capacitance becomes greater and the high frequency characteristic is lowered. In addition, the electric field is concentrated on the drain edge of the recess and, hence, the operability of drain with a high voltage is deteriorated. On the other hand, when the first conductive layer is thin and a small recess is provided therein, the conductive layer not alloyed below the source and drain electrodes is thin and hence the contact resistance becomes greater. Namely, the source resistance including the contact resistance is naturally increased.

SUMMARY OF THE INVENTION

It is therefore an object of the present invention to provide a field effect transistor and a method of manufacturing the same in which the gate is formed with a fine gate length, the source series resistance and the gate series resistance are reduced with little increase in the gate parasitic capacitance, and the voltage operable with the drain is increased.

In accordance with the present invention, there is provided a field effect transistor including a channel layer, a gate electrode, a lower contact layer, an upper contact layer, a source electrode, and a drain electrode. The channel layer is formed on a semiconductor substrate, the gate electrode is fabricated in an upright form from the channel layer, and the lower contact layer is disposed on the channel layer. The lower contact layer has a first side surface brought into contact with the gate electrode and a second side surface apart from the gate electrode, the contact layer being arranged on the lower contact layer and being apart from the gate electrode, and the source and drain electrodes being disposed on the upper contact layer.

Additionally, in accordance with the present invention, the upper contact layer has a thickness larger than that of the lower contact layer.

Furthermore, in accordance with the present invention, the lower contact layer is brought into contact with the gate electrode on a side thereof of the source electrode and is apart from the gate electrode on a side thereof of the drain electrode.

In addition, there is provided in accordance with the present invention a method of manufacturing a field effect transistor including a semiconductor growing step, an upper contact forming step, a lower contact contact forming step, a gate electrode forming step, and a source and drain forming step. The semiconductor growing step includes forming a channel layer on a semiconductor substrate and growing thereafter a semiconductor layer on the channel layer, the semiconductor layer having a thickness equivalent to a thickness for a lower contact layer and an upper contact layer. The contact forming step includes forming an opening through a coating layer coating the semiconductor layer up to the semiconductor layer such that a surface side of the semiconductor layer appears in a bottom of the opening, thereby forming the upper contact layer on the surface side of the semiconductor layer. The lower contact forming step includes piling an insulation side wall on an inner surface of the opening and minimizing a size of the opening and forming a hole in the semiconductor layer within the minimized opening such that a lower side of the semiconductor layer appears in the opening, thereby forming the lower contact layer hierarchically disposed with respect to the upper contact layer. The gate electrode forming step includes forming a gate electrode in an upright contour from the channel layer, the gate electrode being brought into contact with the lower contact layer and being apart from the upper contact layer. The source and drain forming step includes forming source and drain regions for ohmic electrodes on the upper contact layer.

Furthermore, in accordance with the present invention, the manufacturing method further includes a wiring forming step which includes piling an insulating layer on the upper contact layer to obtain a smooth surface, making the gate electrode to appear over the insulating layer, and arranging a connection wiring to the gate electrode.

BRIEF DESCRIPTION OF THE DRAWINGS

The objects and features of the present invention will become more apparent from the consideration of the following detailed description taken in conjunction with the accompanying drawings in which:

FIGS. 11 to 15 are cross-sectional views respectively showing steps of the manufacturing process of a field effect transistor in accordance with Prior Art Example 4;

DESCRIPTION OF THE PREFERRED EMBODIMENTS

As described below in relation to various embodiments, the field effect transistor (FET) in accordance with the present invention is different than the aforementioned Prior Art Examples 2 and 3 in which each contact layer is re-grown. Namely, the crystalline layer is successively grown and then an opening is formed beginning at the upper portion thereof, which advantageously minimizes the contact resistance in the boundary or interface.

Additionally, in accordance with the FET of the present invention, the ohmic electrode is not directly arranged on a thin channel layer, which is the case with Prior Art Example 3. That is, a thick contact layer is first brought into contact with the channel layer such that the ohmic electrode is disposed on the thick contact layer. As a result, the contact resistance is lowered and the concentration of electric field is mitigated. Furthermore, the electric field concentration is also prevented because the contact layers are configured in several layers in a quasi-inclined structure.

Also, as will be described below, the FET of the present invention is different than the aforementioned Prior Art Example 4 in which the gate electrode is brought into contact with the single contact layer. In short, Prior Art Example 4 provides a thin contact layer and a thick contact layer such that the thin contact layer is disposed on the gate electrode. This removes the problems associated with the contact resistance of the ohmic electrode and the gate parasitic capacitance, leading to improvement of the device in this connection. Additionally, on the drain side, the contact layers are formed in several layers and hence there appear several concentration points of electric field, which advantageously increases the value of voltage applicable to the drain.

However, the gate electrode is minimized in length, there can occur a two-dimensional short channel effect. Consequently, it is necessary to reduce the channel thickness in association with the gate length. At the same time, the impurity concentration thereof is required to be increased to match the gate threshold voltage. The characteristic of the surface of the channel layer having the minimized thickness is changed due to oxidation or the like. The surface level is therefore altered and becomes sensitive, which can cause fluctuation of the source resistance. Furthermore, the source resistance is varied by holes generated through avalanche on the drain side, which may lead to a kink phenomenon and deterioration in drain current saturation. To overcome the problem, the thickness of the channel layer on the source side is slightly larger that of the channel layer to thereby minimize the disadvantage above, which is effective for the reduction of the source resistance. In addition, this is also efficiently applicable to depletion-type devices.

First embodiment

Figure 18:
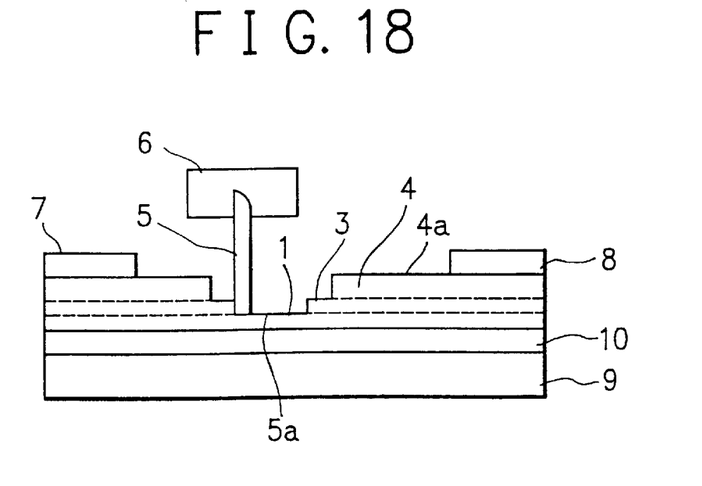
FIG. 18 is a cross-sectional view showing the configuration of a field effect transistor (MESFET) in accordance with the first embodiment of the present invention.

FIG. 18 shows in a cross-sectional view a first embodiment of the field effect transistor in accordance with the present invention. The cross-sectional view is taken along line 18—18 of FIG. 19 which is a plan view of the first embodiment.

Figure 19:
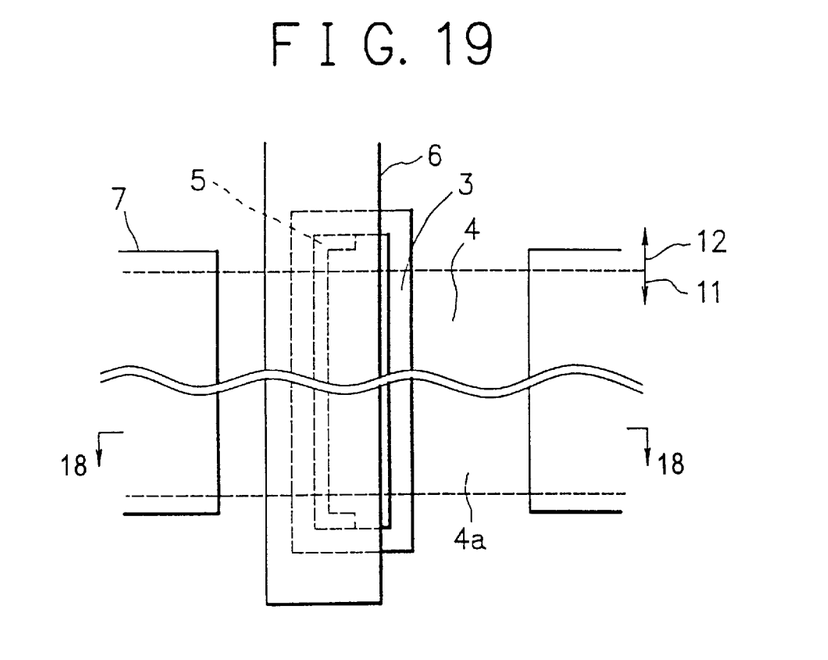
FIG. 19 is a plan view showing the configuration of the field effect transistor (MESFET) in accordance with the first embodiment of the present invention.

The transistor of the first embodiment shown in FIGS. 18 and 19 is obtained by modifying the MESFET of Prior Art Example 4. Namely, on a semi-insulating GaAs substrate 9, there are fabricated an i-type GaAs layer as a buffer layer (not shown) having a thickness of 500 nm and an i-type $Al_{0.3}Ga_{0.7}As$ layer as a buffer layer 10 having a thickness of 200 nm. Formed on the buffer layer is an 80 nm thick GaAs layer as a channel layer 1 having an impurity concentration of $5\times10^{17}$ cm$^{-3}$. On the channel layer 1 is a gate electrode manufactured with molybdenum silicide MoSi in a standing contour having a width or a gate length of 0.1 µm.

Additionally formed on the channel layer 1 is a first contact layer 3 with an n-type GaAs layer having an impurity concentration of $5\times10^{17}$ cm$^{-3}$ and a thickness of 20 nm. The first contact layer 3 has a side wall on the source side to be brought into contact with the gate electrode 5 and a side wall on the drain side to be apart 0.5 µm from the gate electrode 5. On the source and drain sides of the first contact layer 3, a 200 nm thick second contact layer 4 having an impurity concentration of $5\times10^{17}$ cm$^{-3}$ is disposed on the layer 3 beginning at a position apart 0.3 µm from each edge of the first contact layer 3. Moreover, on the second contact layer 4, AuGeNi ohmic electrodes 7 are respectively fabricated at a position shifted 1.0 µm from an edge of the second contact layer 4 toward the source side and at a position shifted 2.0 µm from an edge of the second contact layer 4 toward the drain side.

Additionally, formed on the gate electrode 5 is a gate wiring 6 with molybdenum Mo to reduce the gate resistance, the gate wiring having a vertical length of 0.7 µm and a longitudinal length of 0.7 µm).

Furthermore, as can be seen from FIG. 19, the area other than the device region 11 is used as a device separation region 12, which is a defective zone fabricated by ion implantation of boron B$^+$. The gate electrode 5 having a linear shape is arranged to intersect the device region 11 and the gate wiring 6 is formed to cover the gate electrode 5.

Referring next to FIGS. 20 to 28, description will be given a method of fabricating a field effect transistor in accordance with the first embodiment shown in FIGS. 18 and 19.

Figure 20:
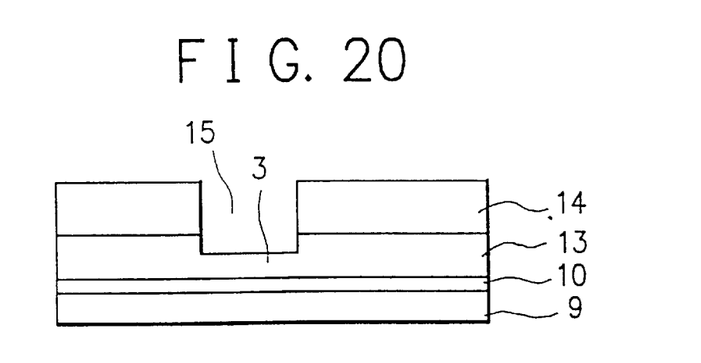
FIGS. 20 to 28 are cross-sectional views respectively showing steps of the manufacturing process of a field effect transistor (MESFET) in accordance with the first embodiment of the present invention.

As shown in FIG. 20, on a semi-insulating GaAs substrate 9, there are formed by molecular beam epitaxial growing a 500 nm thick i-type GaAs layer, not shown, a 200 nm thick i-type $Al_{0.3}Ga_{0.7}As$ as a buffer layer 10 and a 300 nm thick n-type conductive layer 13 having an impurity concentration of $5\times10^{17}$ cm$^{-3}$ in a vertical direction. Additionally, accumulated on the n-type conductive layer 13 is a 1.0 µm insulating $SiO_2$ layer 14. Using a pattern mask of a photoresist layer, a magnetron dry etching process is conducted thereon with $CHF_3$ gas to manufacture an opening 15 having a width of 1.2 µm in the $SiO_2$ layer 14. Applying an etching agent with composition of concentrated phosphate:hydrogen peroxide solution:water=4:1:200 onto a surface of n-type GaAs layer 13 exposed at the bottom of the opening 15, there is formed a first contact layer 3. In this process, there is employed another substrate having a wide opening. Applying two mercury electrode onto the opening, the capacitance of the reverse-directional junction is evaluation such that the etching above is continuously accomplished until the pinch-off voltage Vp becomes −2.0 volt (V). Resultantly, the n-type first contact layer 3 having a thickness of about 100 nm is fabricated in the small opening 15.

Figure 21:
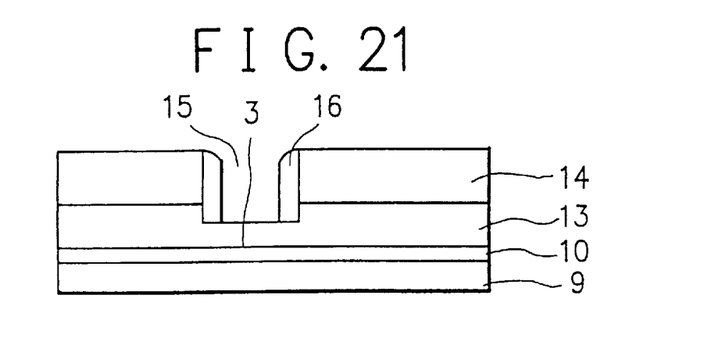

As can be seen from FIG. 21, a 0.4 µm thick $SiO_2$ layer is accumulated as an insulating layer in the opening 15.

Achieving a magnetron dry etching thereon using $CH_3$ gas, there is formed an insulation side wall 16 on the side wall of the opening 15. The insulation side wall 16 has a thickness (width) of 0.3 µm. The crystal etching is conducted in an isotropic fashion because the etching is of a wet type and hence there appears an undercut on the opening 15 of the $SiO_2$ layer 14. However, the insulation film is filled in the undercut in the vapor growth and the upper contour is moved downward in the side wall manufacturing step, which consequently remove the problem associated with the undercut.

Figure 22:
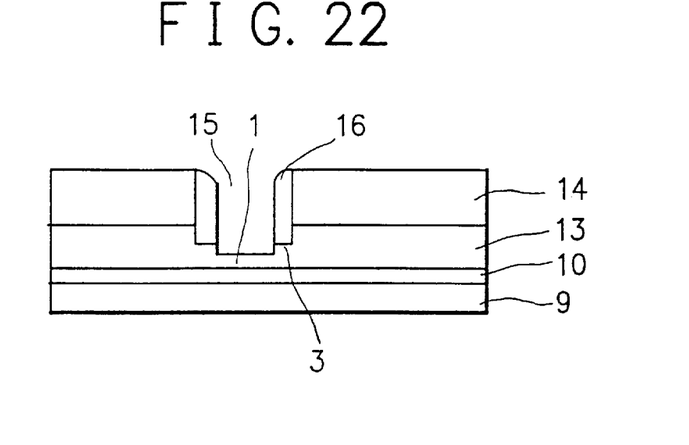

Subsequently, as shown in FIG. 22, using the hydrogen peroxide solution, the etching process is successively carried out with the insulator side wall 16 as a mask until the pinch-off voltage Vp in the opening 15 becomes −1.0 V, thereby forming a channel layer 1. As a result, there is manufactured in the opening 15 an n-type channel layer 1 having a thickness of about 80 nm.

Figure 23:
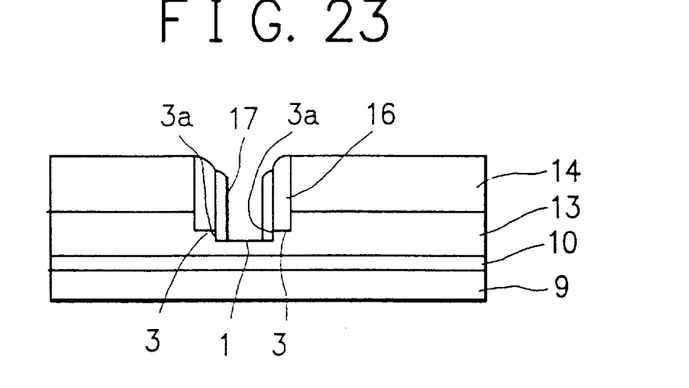

Next, a 0.2 µm $MoSiO_2$ layer is sputtered to be evaporated in a region of the opening 15 as shown in FIG. 23. Conducting an anisotropic dry etching with a magnetron using a mixture gas including $CF_4$ and $O_2$ (20%), there is formed a metal side wall 17 on the insulator side wall 16. In this process, since the amount of evaporated substance is small on the side wall and the etching is effected also in the horizontal direction, the width or gate length is set to 0.1 µm. Moreover, the second crystal etching is accomplished also in an isotropic manner. However, due to the small etching depth, i.e., about 20 nm=0.02 µm and the effect of sputter evaporation, the metal side wall 17 is brought into contact with an edge 3a of the first contact layer 3.

Figure 24:
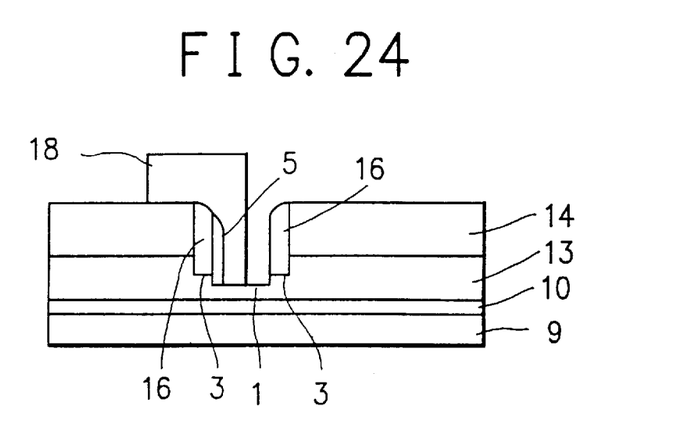

As shown in FIG. 24, with the metal side wall 17 on the source side covered with a photoresist layer 18, there is conducted a dry etching with SF6 gas under an isotropic condition and a gas pressure increased to 30 pascals (Pa). Resultantly, unnecessary portions of the metal side wall 17 are removed, namely, the remaining metal side wall 17 is utilized as a gate electrode 5 and then the photoresist layer 18 is removed.

Figure 25:
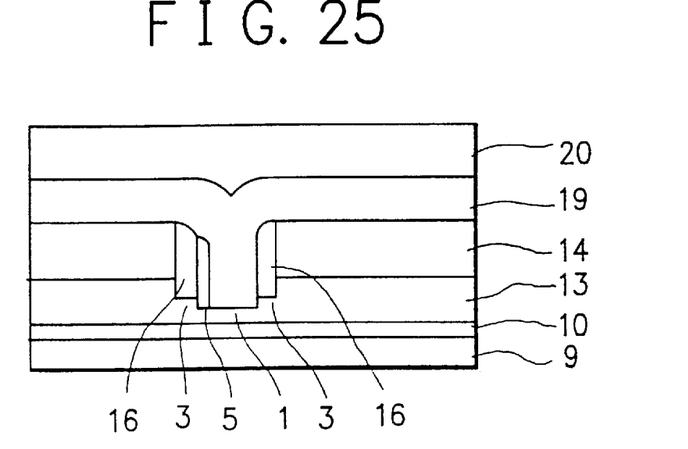

Thereafter, as shown in FIG. 25, a 1.0 µm thick SiO layer 19 is accumulated in a region of the opening 15 and the $SiO_2$ layer 14. Achieving a heating treatment thereon, the defects caused by the sputtering and evaporation as well as the drying process are restored. Applied then onto the $SiO_2$ layer 19 is a photoresist layer 20 having a thickness of 1.0 µm.

Figure 26:
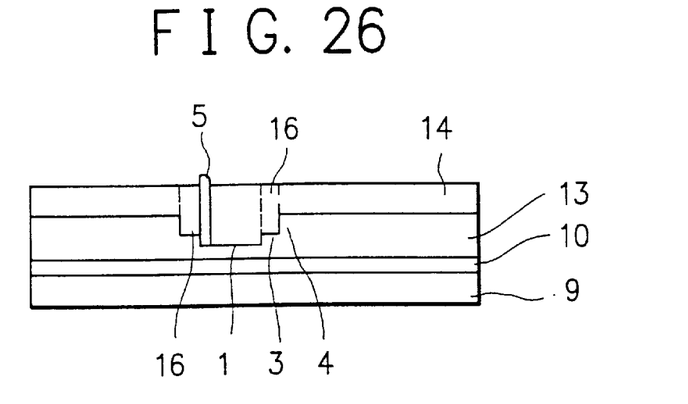

In FIG. 26, taking advantage of the flat surface of the photoresist layer 20, the overall surface is etched by reactive ion etching (RIE) using $CF_4$ gas such that an upper edge of the gate electrode 5 appears from the $SiO_2$ layer 14. In this process, $O_2$ gas is not employed to prevent the $MoSi_2$ layer of the gate electrode 5 from being etched. Under this condition, the etching speed of $SiO_2$ is about two times that of the photoresist and hence there exists a tendency that the recessed portion becomes higher. However, the surface itself of the $SiO_2$ layer 14 is gradually smoothed. Additionally, the etching period of time is supervised according to the associated data obtained by fabricating a 1.0 µm $SiO_2$ layer and a photoresist layer on a substrate other than the substrate 9.

Figure 27:
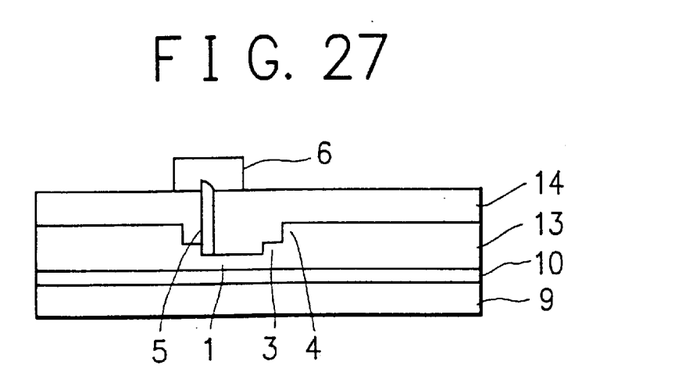

As can be seen from FIG. 27, a 0.7 µm thick Mo layer is accumulated to cover the gate electrode 5 projecting from the $SiO_2$ layer 14 and then a drying process is conducted thereon to manufacture a gate wiring 6 connected to the exposed gate electrode 5.

Figure 28:
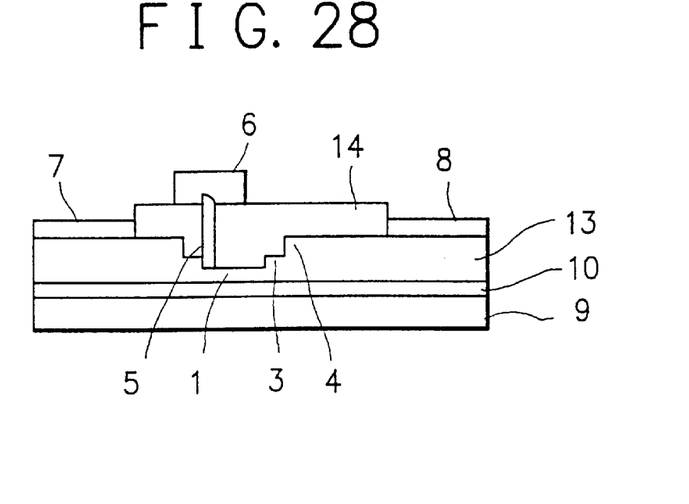

In FIG. 28, on an n-type GaAs layer 13 as a second contact layer 4, a source electrode 7 and a drain electrode 8 are formed as alloy ohmic electrodes with AuGeNi undergone a heat treatment at 450° C. The remaining portions of the SiO$_2$ layer 14 is then removed using buffered fluoric acid or the like to resultantly attained the device structure shown in FIG. 18.

Thereafter, to stabilize the device characteristics for the suppression of the gate parasitic capacitance, a 0.1 μm thick SiO$_2$ layer is grown thereon so as to evaluate the characteristics thereof.

As a result of evaluation, the MESFET in accordance with the present invention has the following characteristic. Incidentally, the gate width W$_G$ thereof is 100 μm.

Gate threshold voltage V$_T$=−1.4 V (V$_D$=2 V, I$_D$=0.1 mA)

Source resistance Rs=0.4Ωmm

Mutual conductance gm=290 mS/mm (V$_G$=0 V)

3-terminal drain voltage BV$_D$=15 V (maximum drain voltage when V$_G$ is changed with I$_D$=0.1 mA)

Cutoff frequency f$_T$=83 GHz

Next, description will be given of the characteristics is association with the configuration of contact layers. Since the comparison of the characteristics with those of the Prior Art Examples are attended with difficulty, the relationship between contact layers and FET characteristics is investigated assuming that the power supply wiring is disposed on an upper portion of the gate electrode and the V$_T$ value is substantially kept unchanged.

Figure 16:
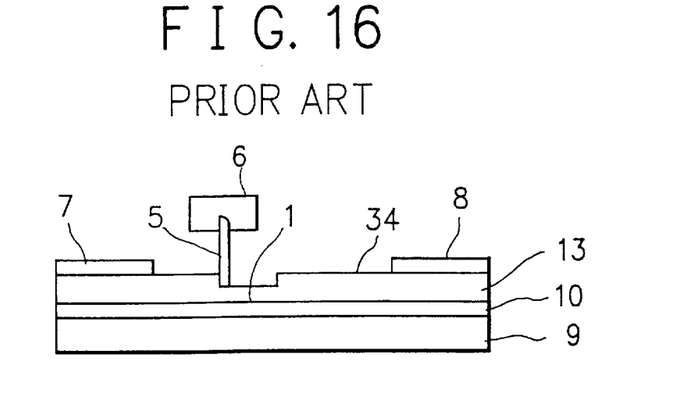
FIGS. 16 and 17 are cross-sectional views of conventional devices schematically showing the configurations thereof to be compared with that of a first embodiment of the field effect transistor in accordance with the present invention.

In a case in which there is provided only one contact layer, namely, the contact layer 34 and the layer 34 is brought into contact with the gate electrode 5 as shown in FIG. 16, there is obtained a relationship between the contact layer thickness (recess depth) tc, source resistance Rs, mutual conductance gm, maximum drain voltage BV$_D$, and cutoff frequency f$_T$ as follows.

| tc (nm) | 20 | 50 | 100 |
|---|---|---|---|
| Rs (Ωmm) | 1.4 | 0.8 | 0.3 |
| gm (mS/mm) | 190 | 230 | 320 |
| BV$_D$ (V) | 9 | 12 | 11 |
| f$_t$ (GHz) | 57 | 68 | 53 |

Namely, the greater the thickness of the contact layer is, the smaller the source resistance Rs becomes. Therefore, the mutual conductance gm is increased. The cutoff frequency f$_T$ takes the maximum value when the contact layer has a thickness of 50 nm. However, when the thickness of the contact layer is 100 nm, the cutoff frequency f$_T$ is lowered. This possibly implies that the reduction in the source resistance Rs contributes to the improvement of the cutoff frequency when the contact layer is thin. However, when the thickness of the contact layer exceeds a certain value, the gate parasitic capacitance is increased due to the contact between the side wall of the contact layer and the gate electrode and hence the cutoff frequency f$_T$ is decreased.

The maximum drain voltage BV$_D$ becomes higher when the contact layer is increased in thickness. For a thin contact layer having a thickness of 20 nanometer, the electric field is concentrated onto the ends of the ohmic drain electrode. It can be considered that when the contact layer becomes thicker, the concentration of electric field is shifted toward the recess edge and hence is distributed. In accordance with the present invention, the maximum drain voltage BV$_D$ is higher than that of the device shown in FIG. 33. This means that the electric field concentration is distributed and mitigated due to the two-layer structure including contact layers 3 and 4.

Figure 17:
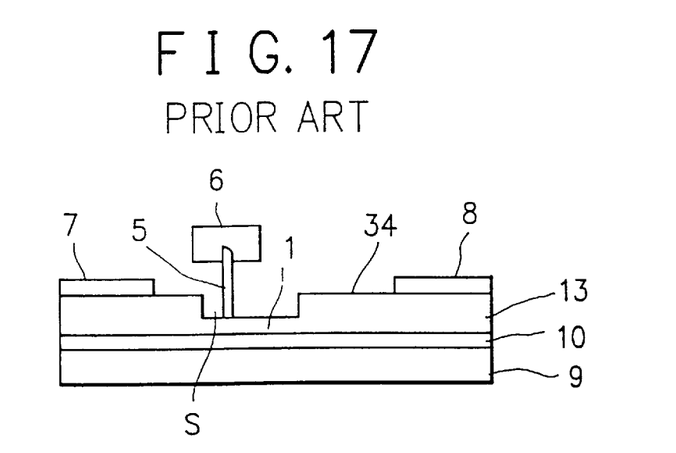

In the case of FIG. 17 in which the contact layer 34 has a thickness of 100 nm and a 0.3 μm interval or gap S is provided between the gate electrode 5 and the contact layer 34, the source resistance Rs. mutual conductance gm, maximum drain voltage BV$_D$, and cutoff frequency f$_T$ are obtained as Rs=0.6Ωmm, gm=260 mS/mm, BV$_D$=13 V, and f$_T$=75 GHz.

Since the channel layer 1 takes a large negative value, when the gap S is disposed between the contact layer 34 and the gate electrode 5, the cutoff frequency f$_T$ can take a large value without greatly increasing the source resistance Rs. However, the device constructed as shown in FIG. 17 has the characteristics less improved when compared with those obtained in accordance with the present invention. Namely, thanks to two contact layers on the source side in accordance with the present invention, there are advantageously obtained the characteristic values above more improved when compared with those of FIG. 17.

In the device structured as shown in FIG. 16, a kink phenomenon in which the drain current increased in a step-by-step fashion become conspicuous when the drain voltage is in the vicinity of 5 volts. When the drain voltage becomes greater, the drain current is increased and the saturation characteristic is deteriorated. In contrast therewith, thanks to the configuration in which the contact layer 3 on the source side is brought into contact with the gate electrode 5 in accordance with the present invention, there is obtained an advantageous effect as described above.

The source resistance is measured as follows. With a fixed current kept supplied to the junction gate, the drain current is changed to measure the associated variation in the gate voltage. The gate voltage thus attained is a positive value in the neighborhood of the built-in voltage, and the gate depletion layer is contracted on the source side. The potential is propagated also on the exposed channel surface in the proximity of the gate and hence the surface depletion layer is contracted. Therefore, the source resistance actually measured can be considered to be less than that obtained when the gate is at a negative voltage in the amplifying operation. Conversely, in the surface near the gate during the operation, the surface depletion layer is altered in a parasitic FET manner. Consequently, it can be assumed that when the exposed crystal surface 4a of the contact layer 4 of FIG. 18 is higher than the gate surface 5a in accordance with the present invention, the gate depeletion layer is less influenced and hence the kink phenomenon and the like are suppressed.

Embodiment 2

Figure 29:
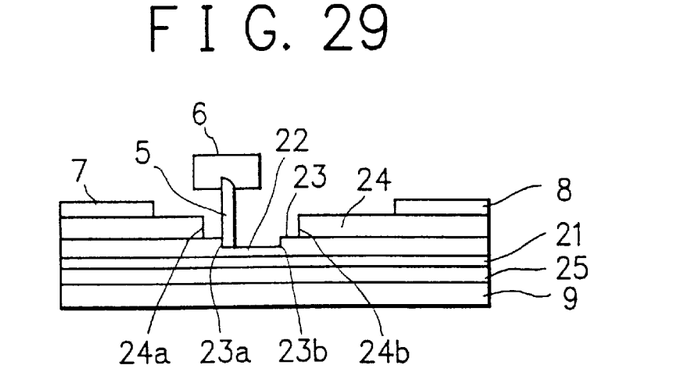
FIGS. 29 to 31 are cross-sectional views respectively showing steps of the manufacturing process of a field effect transistor (MESFET) in accordance with a second embodiment of the present invention.

FIG. 29 shows in a cross-sectional view a second embodiment of a hetero-junction field effect transistor (HJFET) in accordance with the present invention.

In FIG. 29, on a semi-insulating GaAs substrate 9, there are fabricated a 500 nm thick i-type GaAs layer as a buffer layer 25, a 15 nm thick i-type In$_{0.15}$Ga$_{0.35}$As layer as an electron transfer layer 21, and a 30 nm thick n-type Al$_{0.2}$Ga$_{0.8}$As layer as an electron supply layer 22 having an impurity concentration of 2×10$^{18}$ cm$^{-3}$. Disposed on the electron supply layer 22 is an upright gate electrode 5 of a WSi$_{0.6}$ layer having a gate length of 0.1 μm.

Additionally, arranged on the electron supply layer 22 is a 10 nm thick Al$_{0.2}$Ga$_{0.8}$As layer as a first contact layer 23 having an impurity concentration of 2×10$^{18}$cm$^{-3}$.

On the source side, the layer 23 has a side wall 23a brought into contact with the gate electrode 5. On the drain side, the layer 23 has a side wall 23b apart 0.5 μm from the gate electrode 5. On the first contact layer 23 on each of the source and drain sides, there is manufactured a 100 nm thick n-type GaAs layer as a second conduct layer 24 having an impurity concentration of 2×10$^{18}$ cm$^{-3}$. The edge of second contact layer 24 is apart 0.3 μm from the associated side surface 23a or 23b of the first contact layer 23.

In addition, fabricated on the second contact layer 24 are a AuGeNi ohmic electrode 7 apart 1.0 μm from a side surface 24a of the layer 24 and a AuGeNi ohmic electrode 8 apart 2.0 μm from a side surface 24b of the layer 24. Manufactured on the gate electrode 5 is a gate wiring 6 with tungsten W to lower the gate electrode.

In the HJFET of FIG. 29 in accordance with the present invention, between the n-type AlGaAs as the electron supply layer 22 and the i-type InGaAs as the electron transfer layer 21, there appears a two-dimensional electron gas (2DEG) having a high mobility on a hetero-junction domain on the side of the electron transfer layer 21, which advantageously results in a high current density. On the other hand, the n-type AlGaAs as the electron supply layer 22 is also conductive and hence an electric current flows therethrough in a parasitic fashion, the electron supply layer 22 and the electron transfer layer 21 correspond to the channel layer of the MESFET.

In the method of fabricating the HJFET of the second embodiment shown in FIG. 29, the manufacturing procedure of the electrodes is almost the same as that of the first embodiment. Although the electrode material varies therebetween, to fabricate the gate electrode 5 of $WSi_{0.6}$ and the power supply wiring 6 of tungsten W, there are conducted a sputtering and evaporation process followed by an anisotropic dry etching with a mixture gas using a magnetron, the gas including $CF_4$ and $O_2$ (20%).

Figure 30:
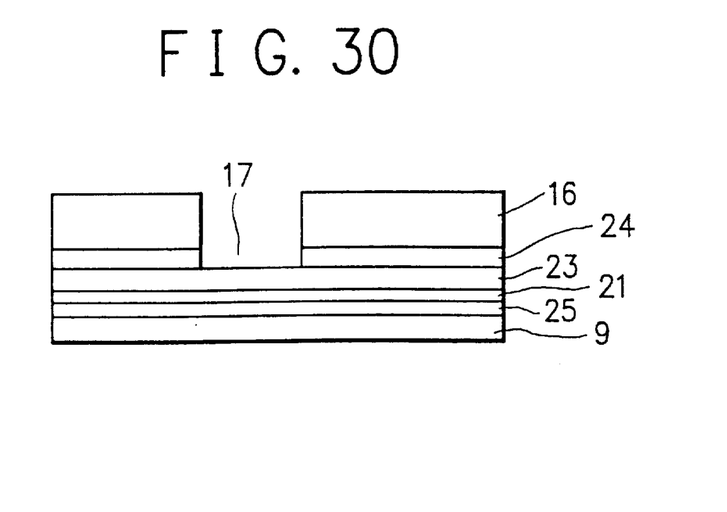

Referring next to FIGS. 30 and 31, description will be given of a process of manufacturing crystal structure different from the manufacturing process employed in the first embodiment. First, as can be seen from FIG. 30, constituent layers are grown on a semi-insulating GaAs substrate 9 by a metal organic chemical deposition (MOVPE) in the following sequence.

Buffer layer 25:i-type GaAs, thickness=500 nm

Electron transfer layer 21:i-type $In_{0.15}Ga_{0.85}As$, thickness=15 nm

First contact layer 23 and electron supply layer 22:n-type $Al_{0.2}Ga_{0.8}As$, impurity concentration=$2\times10^{18}$ $cm^{-3}$, thickness=30 nm Second contact layer 24:n-type GaAs, impurity concentration=$2\times10^{19}$ $cm^{-3}$, thickness=100 nm Subsequently, a 10 μm $SiO_2$ layer 16 is piled on the second contact layer 24 and then an opening 17 is formed therein in the same way as for the first embodiment. In a magnetron dry etching with gas ($BCl_3+SF_6$ (30%)), the n-type GaAs layer as the second contact layer 24 is selectively etched. The added fluoric acid F reacts on the AlGaAs surface of the first contact layer 23 to produce AlF. As a result, the etching is suppressed and terminated. The etching selection ratio between GaAs and AlGaAs is 100 or more.

Figure 31:
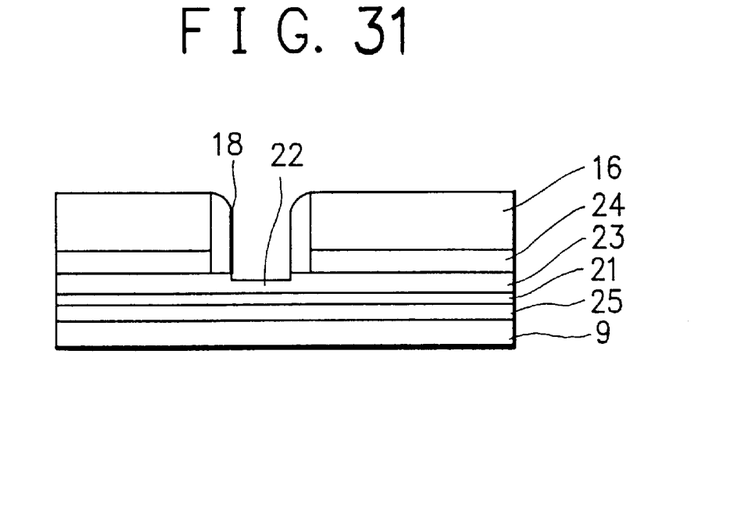

An $SiO_2$ layer is accumulated thereon like in the first embodiment as shown in FIG. 31. Using an anisotropic machining process, an insulator side wall 18 is provided on a sidewall of the opening 17. The AlGaAs region of the first contact layer 23 appearing in the bottom of the opening 17 is etched in a depth of 10 nm using solution of hydrogen perioxide phosphate to thereby manufacture an electron supply layer of n-type AlGaAs. Thereafter, electrodes are fabricated in a manner similar to that used in the first embodiment.

The HJFET of the embodiment shown in FIG. 29 develops the following characteristics. In this connection, the gate width $W_G$ is 100 μm and $SiO_2$ is grown to a thin film having a thickness of 0.1 μm for the characteristic measurement.

Gate threshold voltage $V_T$=−1.3 V

Source resistance Rs=0.3Ωmm

Mutual conductance gm=580 mS/mm ($V_G$=0 V)

3 terminal drain voltage $BV_D$=11 V (maximum drain voltage when $V_G$ is altered with $I_D$=0.1 mA)

Cutoff frequency $f_T$=120 GHz

As above, there are guaranteed high values for the cutoff frequency $f_T$ and mutual conductance gm. In addition, the kink phenomenon is suppressed and a favorable characteristic is obtained for the drain current saturation. Namely, there are attained advantageous features like in the first embodiment.

Third embodiment

Figure 32:
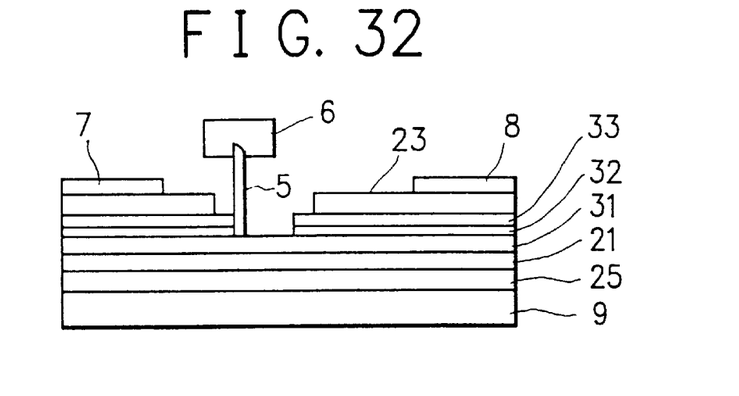
FIG. 32 is a cross-sectional view showing the construction of a third embodiment of the field effect transistor (MESFET) in accordance with the present invention.

Description will be given of a third embodiment of the present invention by referring to FIG. 32. This embodiment is attained by improving the HJFET of the second embodiment. In the third embodiment, the configuration related to the electron supply layer 22 and the first contact layer 23 of the second embodiment shown in FIG. 29 are modified. Namely, in accordance with the third embodiment, there are provided a 20 nm thick n-type $Al_{0.2}Ga_{0.8}As$ layer as an electron supply layer 31 having an impurity concentration of $2\times10^{18}$ $cm^{-3}$, an 8 nm thick n-type GaAs layer as a first contact layer 32 having an impurity concentration of $2\times10^{18}$ $cm^{-3}$, and a 2 nm thick n-type $Al_{0.2}Ga_{0.8}As$ layer as an etching termination layer 33 having an impurity concentration of $2\times10^{18}$ $cm^{-3}$. Fabricated on the electron supply layer 31 is a gate electrode 5 to be brought into side surfaces or walls respectively of the first contact layer 32 and the etching termination layer 33. Moreover, the etching termination layer 33 is arranged on the first contact layer 32 in the third embodiment. In this regard, the etching termination layer 33 is partly functions as the first contact layer 32.

Figure 33:
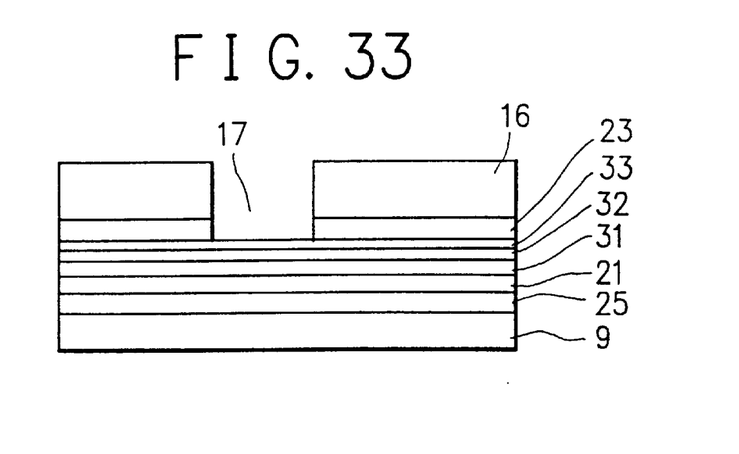
FIGS. 33 and 34 are cross-sectional views respectively showing steps of the manufacturing process of the field effect transistor (MESFET) in accordance with the third embodiment of the present invention.

Referring now to FIGS. 33 and 34, description will be given of a method of manufacturing the HJFET of the third embodiment shown in FIG. 32. As can be seen from FIG. 33, in a manner similar to that employed in the second embodiment, an opening 17 is formed in an accumulated $SiO_2$ layer 16. The n-type GaAs layer as the second contact layer 23 is etched in a selective crystal machining process such that the n-type AlGaAs surface of the etching termination layer 33 appears in the bottom of the opening 17.

Figure 34:
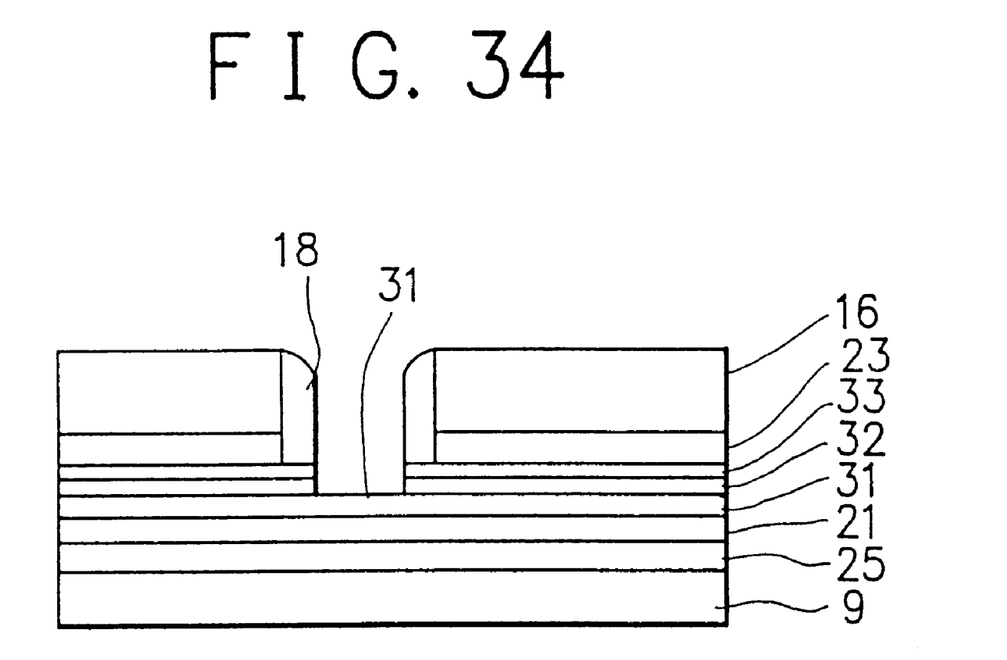

In FIG. 34, an $SiO_2$ layer is piled to undergo an anisotropic machining process such that an insulation layer side wall 18 is formed on a side wall of the opening 17. The n-type AlGaAs region of the etching termination layer 33 in the bottom of the opening is etched using a solution of so that the n-type GaAs area of the first contact layer 32 appear in the bottom of the opening 17. The n-type GaAs area of the first contact layer 32 is etched in a selective crystal machining step such that the n-type AlGaAs region of the electron supply layer 31 appears in the bottom of the opening 17. Thereafter, electrodes are fabricated in the same fashion as for the first embodiments.

In the second embodiment, the crystal is etched through a narrow opening having a width of one μm or less. Therefore, the etching becomes non-uniform due to the unstable supply of etching agent, which leads to fluctuation in such FET characteristics as the gate threshold value and drain current value. In contrast therewith, in accordance with the third embodiment, the crystal etching with a high selectivity is terminated by the etching termination layer 33 of AlGaAs and the etching termination layer 33 is grown in a flat plane. Consequently, the device has an advantageous feature that the film thickness is uniform in the integrated circuit chip. In accordance with the third embodiment, consequently, the problem of the analog and/or digital integrated circuits, i.e., the non-uniformity of elements in circuits can be suppressed. This enables the device to be designed with a state for high performance and hence the production yield can be improved.

As described above, in accordance with the present invention in which the single contact layer to be brought into contact with the gate electrode is dispensed with, there are provided a first contact layer having a smaller thickness and a second contact layer having a larger thickness such that the thin first contact layer is brought into contact with the gate electrode. Therefore, the problem associated with the contact resistance of the ohmic electrode and the gate parasitic capacitance is removed and the disadvantages can be improved at the same time.

Additionally, since the thickness of the contact layer on the source side is slightly thicker than that of the channel layer, the kink phenomenon and the deterioration of the drain current saturation can be suppressed. On the other hand, thanks to the hierarchic or stepwise structure on the drain side in which the contact layer is separated, the concentration of electric field is dispersed to thereby increase the voltage applicable to the drain.

Furthermore, each contact layer is not grown in a continual manner, namely, a crystal layer is continuously grown such that a hole is formed therein so as to obtain contact layers in a hierarchic structure, which advantageously minimized the contact resistance in the junction domain.

In addition, since the thick contact layer is brought into contact with the channel layer and the ohmic electrode is provided on the thick contact layer, the contact resistance is reduced and the concentration of electric field is mitigated. Moreover, since the contact layers form a hierarchic structure including a plurality of layers in a quasi-inclined configuration, the electric field concentration is also mitigated.

The configuration of the prior art in which the single contact layer is brought into contact with the gate electrode is not adopted in the present invention. Namely, there are disposed a thin contact layer and a thick contact layer such that the thin contact layer is brought into contact with the gate electrode. Consequently, there can be removed the problem associated with the contact resistance of the ohmic electrode and the gate parasitic capacitance, and the disadvantages can be simultaneously improved. On the drain side, since a plurality of contact layers are arranged in a hierarchic constitution, the points of electric field concentration can be dispersed to thereby increase the voltage applicable to the drain.

Because of the structure in which the thickness of the contact layer on the source side is slightly thicker than that of the channel layer, there is attained an advantage, in addition to the reduction of the source resistance, that the structure can be efficiently applied to depletion-type devices.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A method of manufacturing a field effect transistor having a source side and a drain side, comprising the steps in sequence of:

a semiconductor growing step;

an upper contact forming step;

a lower contact forming step;

a gate electrode forming step; and a source and drain forming step, the semiconductor growing step including forming a channel layer on a semiconductor substrate and thereafter growing a semiconductor layer on the channel layer, the semiconductor layer having a thickness equivalent to a thickness for a lower contact layer and an upper contact layer, the contact forming step including forming an opening through a coating layer coating the semiconductor layer to the semiconductor layer such that a surface side of the semiconductor layer is exposed at a bottom of the opening, thereby forming the upper contact layer on the surface side of the semiconductor layer, the lower contact forming step including applying an insulation side wall on an inner surface of the opening to minimize a size of the opening and forming a hole in the semiconductor layer within the minimized opening such that a lower side of the semiconductor layer is exposed in the opening, thereby forming the lower contact layer hierarchically disposed with respect to the upper contact layer, the gate electrode forming step including forming a gate electrode in a normal direction from the channel layer, the gate electrode being in contact with the lower contact layer and being spaced apart from the upper contact layer, the source and drain forming step including forming source and drain regions for ohmic electrodes on the upper contact layer after removing portions of the coating layer.

2. A method of manufacturing a field effect transistor in accordance with claim 1, further including a wiring forming step, the wiring forming step including applying an insulating layer on the upper contact layer to form a smooth surface, etching the insulating layer to expose an upper end of the gate electrode, and forming a gate wiring connected to the gate electrode.

* * * * *